United States Patent [19]

Pelleteir

[11] Patent Number: 5,216,329

[45] Date of Patent: Jun. 1, 1993

[54] DEVICE FOR DISTRIBUTING A MICROWAVE ENERGY FOR EXCITING A PLASMA

[75] Inventor: Jacques Pelleteir, St Martin D'Heres, France

[73] Assignee: Sociéte à Responsabilité Limitée: Metal Process, France

[21] Appl. No.: 824,210

[22] Filed: Jan. 22, 1992

[30] Foreign Application Priority Data

Jan. 22, 1991 [FR] France .................. 91 00894

[51] Int. Cl.⁵ .............................................. H05H 1/18
[52] U.S. Cl. ........................... 315/111.41; 315/111.21; 315/111.71; 313/231.31
[58] Field of Search ............ 315/111.21, 111.41, 315/111.51, 111.71, 111.81; 313/231.31

[56] References Cited

U.S. PATENT DOCUMENTS

| | | |
|---|---|---|
| 4,713,585 | 12/1987 | Ohno et al. .................. 315/111.21 X |
| 4,716,491 | 12/1987 | Ohno et al. .................. 315/111.71 X |
| 4,745,337 | 5/1988 | Pichot et al. .................. 315/111.41 |
| 4,810,935 | 3/1989 | Boswell ........................ 315/111.41 |
| 4,939,424 | 7/1990 | Kieser et al. ................. 315/111.41 X |
| 4,992,696 | 2/1991 | Prueitt et al. ................ 315/111.71 X |
| 5,081,398 | 1/1992 | Asmussen et al. ............ 315/111.21 X |

Primary Examiner—Eugene R. LaRoche
Assistant Examiner—Do Hyun Yoo
Attorney, Agent, or Firm—Bacon & Thomas

[57] ABSTRACT

A device for distributing microwave energy in order to excite a plasma inside an enclosure includes one or more applicators. Each applicator is placed inside the intermagnet zone and extends in distant relationship to the confinement surface and to the enclosure wall, while being positioned outside the surface having a constant magnetic field and an intensity corresponding to the electronic cyclotron resonance, so as to ensure the confinement and propagation of the microwave energy between the wall and the applicator, outside of the surface.

10 Claims, 4 Drawing Sheets

DEVICE FOR DISTRIBUTING A MICROWAVE ENERGY FOR EXCITING A PLASMA

FIELD OF THE INVENTION

The present invention relates to the general technical field of plasma production from any type of gaseous medium, for use in a varied number of applications, such as surface treatments or the production of ion beams.

The invention relates more particularly to the excitation of a plasma by microwaves, and particularly at the electronic cyclotron resonance.

BACKGROUND OF THE INVENTION

French Patent No. 85-08836 (2 583 250) describes a technique for exciting plasma at the electronic cyclotron resonance. Such resonance is obtained for a magnetic field B and an excitation frequency f linked by the relation $$B = \frac{2\pi m f}{e}$$

in which m and e are the mass and charge of the electron. For example, for a frequency of 2.45 GHz, a magnetic field of 0.0875 Tesla is necessary to obtain the resonance.

The technique described in said French Patent Application requires the use of permanent magnets, each one of which creates, near its pole, at least one surface having a constant magnetic field and of intensity corresponding to the electronic cyclotron resonance. The electromagnetic energy is brought to the level of the resonance zone via antennas or plasma exciters, each one constituted by a metal wire element. Each exciter is placed in vertical relationship to the permanent magnets which are mounted on the wall of the enclosure.

The magnetic field of intensity equal to the value giving the resonance, and the electromagnetic field are both situated and confined essentially in the space existing between an exciter and the part of the enclosure wall placed in facing relationship to a magnet. In the presence of a gaseous medium of reduced pressure, the electrons are accelerated in the resonance zone and wind around the lines of magnetic field which define a surface for confining the plasma. Said field lines, which are scallop-shaped, join the pole of one magnet to its opposite pole or to the opposite pole of the next magnet. Along its path, the electron dissociates and ionizes the molecules and the atoms with which it collides. Then, the plasma which has thus formed in the scallops of magnetic field diffuses from said field lines in order to form a cold plasma virtually free of energetic electrons, these remaining trapped in the scallops.

With no gas in the enclosure, the microwave energy propagates without any loss along the exciter constituted by the wire applicator positioned close to the poles of the permanent magnets. With a gas to be ionized in the enclosure, the plasma is excited with the electronic cyclotron resonance and therefore there has to be losses when the microwaves propagate and the available microwave power reduces gradually from the microwave source along the exciter. It is also found that the plasma density reduces at the same time as the microwave power.

Another disadvantage of the above-described technique resides in the fact that the microwave energy can only be applied to one of the ends of the wire exciter. As a result, the microwave energy cannot be applied to a looped antenna, such as a circular antenna.

SUMMARY OF THE INVENTION

It is therefore the object of the present invention to overcome the above disadvantages by providing a device adapted to ensure the propagation and distribution of the microwave energy with a minimum of losses, over the entire length of the zone of electronic cyclotron resonance, with a view to obtaining a maximum microwave power permitting a virtually constant plasma density.

This object is reached with a device for distributing a microwave energy for exciting a plasma inside an enclosure, which device comprises, on the one hand, at least one applicator for applying an energy of microwave type, and on the other hand, at least one pair of permanent magnets, each magnet creating a surface having a constant magnetic field and of intensity corresponding to the electronic cyclotron resonance, said oppositely poled magnets being so spaced apart as to define a plasma confining surface which delimits an inter-magnet zone with part of the enclosure wall.

According to the invention, the applicator or applicators are placed, each one, inside the inter-magnet zone and extend in distant relationship to the confinement surface and to the enclosure wall, while being positioned outside the surface having a constant magnetic field and an intensity corresponding to the electronic cyclotron resonance, in order to ensure the confinement and propagation of the microwave energy between the wall and the applicator, outside of the surface.

The object of the invention is therefore to ensure the propagation of the microwave energy in a localized area where the plasma excitation conditions, particularly at the electronic cyclotron resonance, are not met. Propagation of the microwave energy in the inter-magnet zone situated outside the electronic cyclotron resonance can be performed without any significant losses.

BRIEF DESCRIPTION OF THE DRAWINGS

The invention will be more readily understood on reading the following description given with reference to the accompanying drawings, in which.

DETAILED DESCRIPTION OF PREFERRED EMBODIMENTS

Figure 1:
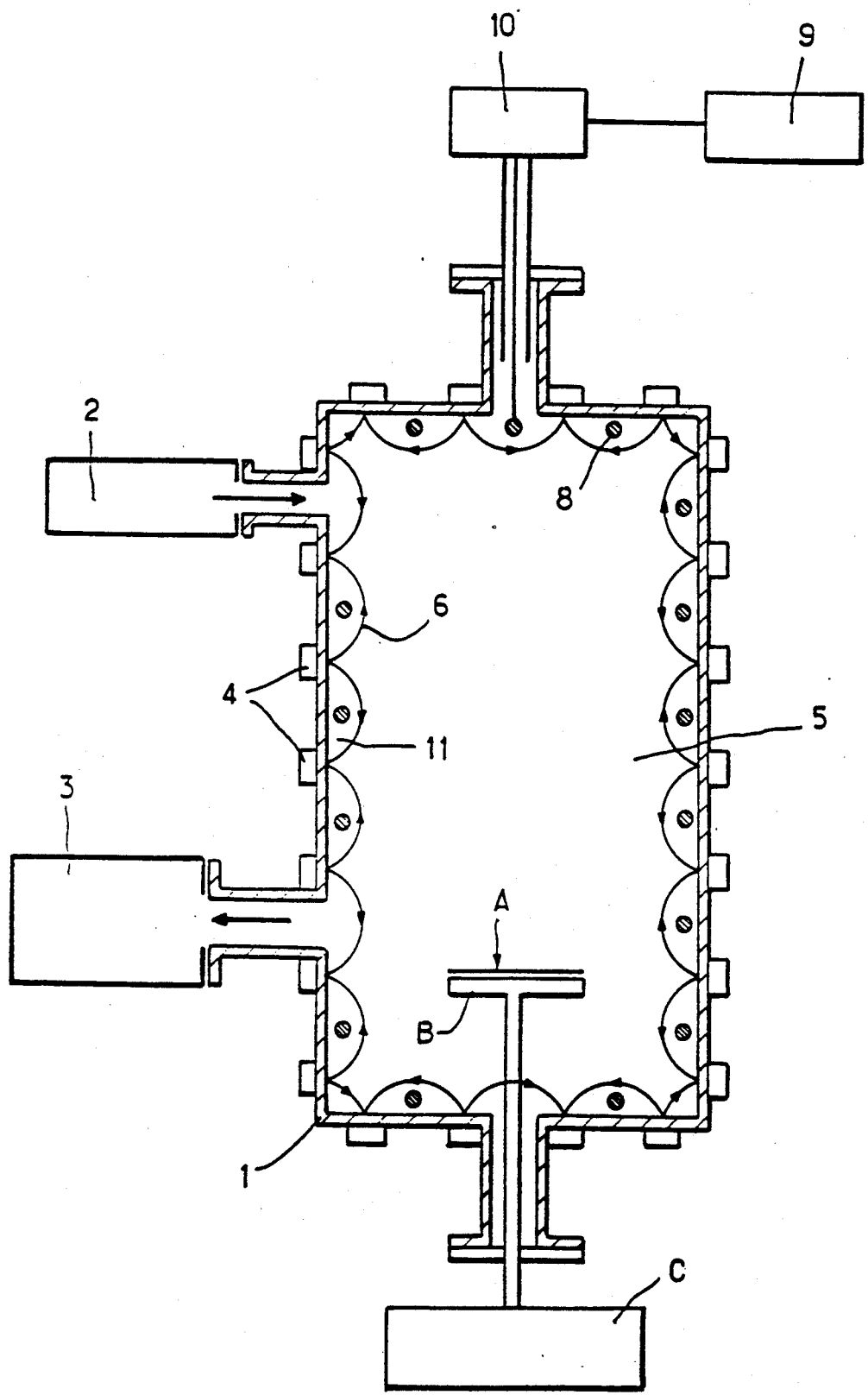
FIG. 1 illustrates diagrammatically a plasma production machine using a device for distributing a microwave energy according to the invention.

Referring first to FIG. 1, this shows, by way of example, a machine for producing plasma from any type of gaseous medium, for use in a varied number of applications, such as surface treatments or production of ion beams. The machine comprises a non-magnetic tight enclosure 1, equipped with a gas-introducing device 2 and a gas-pumping device 3 enabling the pressure of the gas to be ionized, to be kept to a desired value ranging, for example, between $10^{-2}$ and a few Pascals. The machine also comprises a device according to the invention for distributing a microwave energy to excite said plasma, at electronic cyclotron resonance. To this effect, the device comprises a multi-polar magnetic structure constituted by at least two, and for example, a series of permanent magnets 4 confining the plasma in a central zone 5. The plasma makes it possible to carry out, in the zone of use 5, a surface treatment on a sample A, placed on a sample-holder B and polarized with respect to the plasma potential by means of a generator C.

The permanent magnets 4, which extend substantially in parallel relationship, present successively, to the plasma, alternating polarities, so as to constitute a magnetic surface 6 which is in the form of scallops of magnetic field lines. It should be noted that the magnets 4 are so positioned that the scallop-forming lines of magnetic field connect the pole of one magnet to its opposite pole or to the opposite pole of the next magnet. In this way, the plasma is confined in the zone 5 inside the scallops of lines of magnetic field 6. The multipolar magnetic structure is produced in such a way that a magnetic field is obtained locally, which is of sufficient intensity to ensure electronic cyclotron resonance. As more specifically illustrated in FIG. 2, each magnet 4 is capable of creating a surface 7 having a constant magnetic field, and of intensity corresponding to the electronic cyclotron resonance. Said surface 7 encircles the poles of the magnets, as illustrated in dashed lines in FIG. 2. For example, for an excitation frequency of 2.45 GHz, the magnetic field should be 0.0875 Tesla and for an excitation frequency of 5.8 GHz, the intensity of the magnetic field should be 0.207 Tesla.

The distribution device according to the invention further comprises at least one, and in the illustrated example, a series of applicators 8 for applying a microwave type energy and positioned in a given localized area. Said applicators 8 are connected by any suitable means, to a microwave energy generator 9 via an impedance adaptor 10. According to the invention, for every pair of magnets 4, the associated applicator 8 is positioned inside a zone 11 created between two successive magnets and defined by that part of the wall of the enclosure 1 situated in facing relationship and by the plasma confinement surface 6. Thus, the zone 11 between the magnets extends beyond the plasma confinement zone 5 between the confinement surface 6 and the wall of enclosure 1. Preferably, the magnets 4 are outside the enclosure wall, as illustrated in the drawings.

According to the invention, the applicator 8 is placed in distant relationship to the confinement surface 6 and to the wall of enclosure 1, while being advantageously positioned outside the surface 7 having a constant magnetic field and of intensity corresponding to the electronic cyclotron resonance.

Such a disposition of the applicator 8 allows the confinement and propagation of the microwave energy with a minimum of losses between the applicator and the corresponding part of the wall of enclosure 1. Indeed, the dense plasma created in the confinement surfaces 6, behaves as a conductor and the microwave energy remains confined in the internal scalloped zone 11. The plasma is excited from the surface 7 having a constant magnetic field and of intensity corresponding to the electronic cyclotron resonance.

A fact to be considered is that the higher the magnetic field and the greater the surface areas 7 having constant magnetic field and of intensity equal to the resonance, the better the magnetic confinement and the coupling of the microwave energy. Accordingly, it must be considered that the object of the invention can be used with magnets producing a magnetic field whose intensity is higher, but in any case at least equal to that corresponding to the electronic cyclotron resonance.

Advantageously, applicator 8 is situated at a given distance from the wall 1 in facing relationship thereto (about 1 cm) so as not to produce any arcs of plasma between the wall of the enclosure and the applicator 8 at the normal working pressures of plasmas excited at the electronic cyclotron resonance (ranging between $10^{-2}$ and a few Pascals, depending on the nature of the gas). Moreover, applicator 8 is placed in zone 11 so as not to cut the confinement surface 6, where the plasma is excited.

Figure 2:
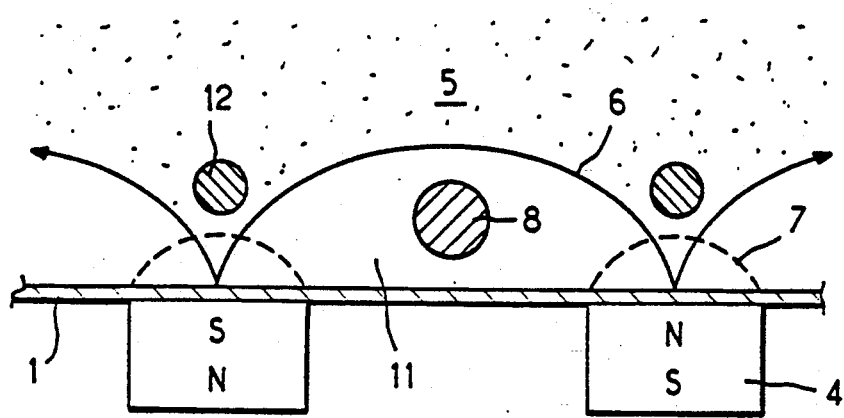
FIG. 2 illustrates an elementary distribution device according to the invention.

According to an embodiment of the object of the invention, wire antennas or applicators 12 are positioned in any possible arrangement with respect to the magnets 4 so as to be situated at least near the surface 7 having a constant magnetic field and of intensity corresponding to the electronic cyclotron resonance (FIG. 2). Preferably, said antennas 12 which are not connected to a source of microwave energy, are placed, each one, at the intersection between the median plane of a magnet and the surface 7. The use of the antennas 12 makes it possible to couple laterally on the latter, the microwave energy propagated by applicators 8. It should thus be possible to decouple, on the one hand, the microwave energy propagation function performed by applicators 8, and on the other hand, the function of exciting the plasma at the electronic cyclotron resonance performed by the antennas 12. In that way, uniform plasma densities can also be obtained along antennas 12.

Figure 3:
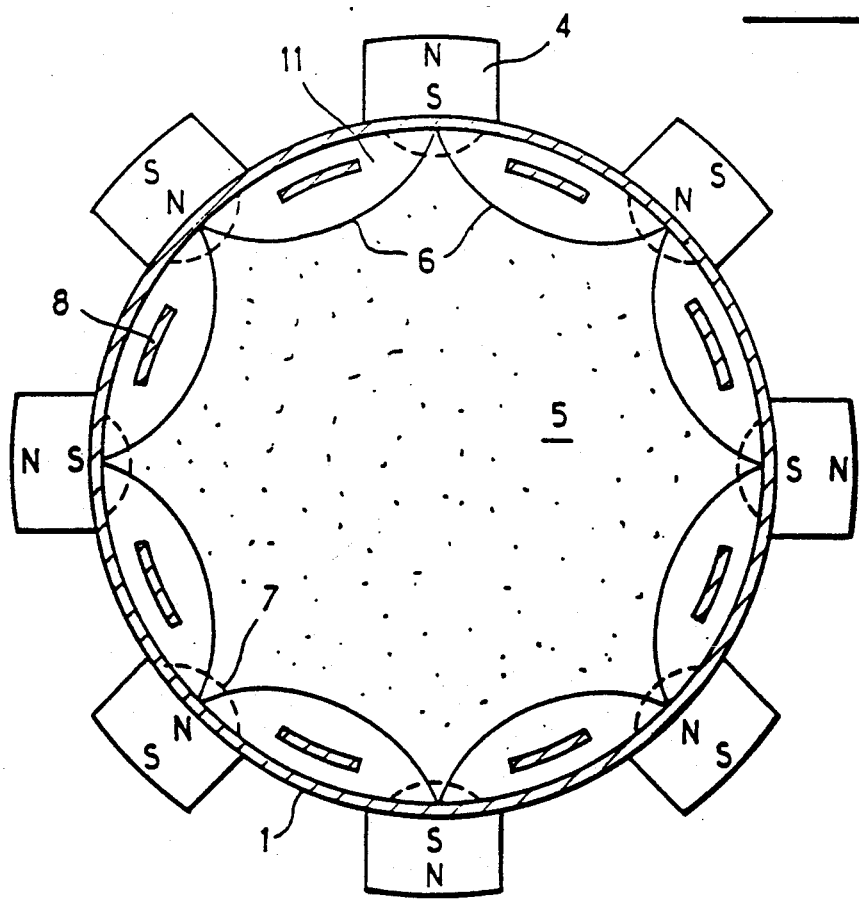
FIG. 3 is a diagrammatical cross-section of a variant embodiment of a device according to the invention.
Figure 4:
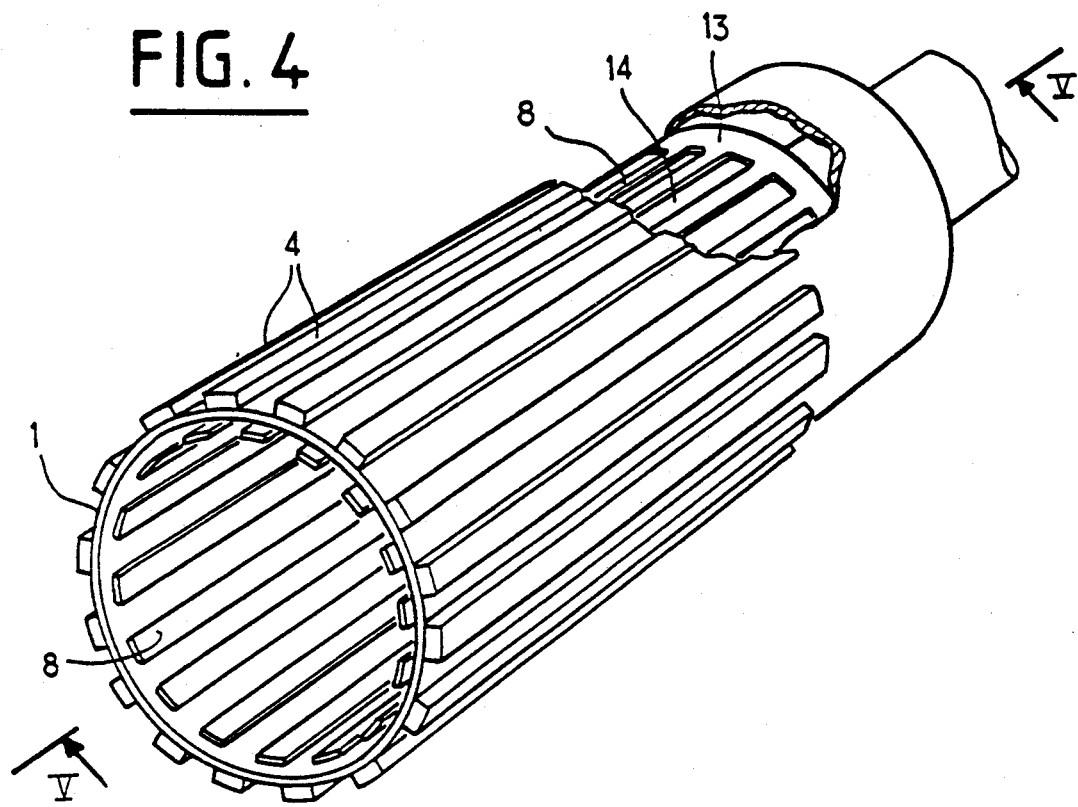
FIG. 4 is a perspective view, illustrating one embodiment of a device according to FIG. 3.
Figure 5:
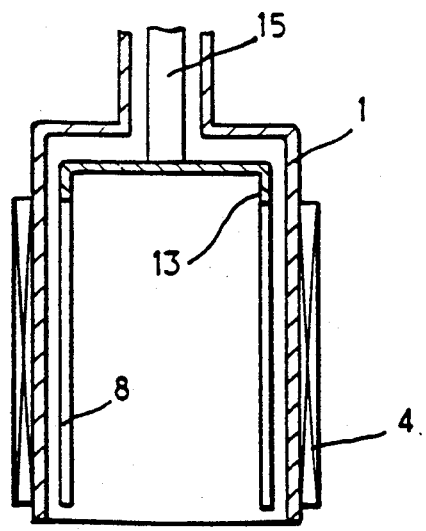
FIG. 5 is a cross-sectional view taken substantially along lines V—V of FIG. 4.

As more precisely illustrated in FIGS. 3 to 5, applicators 8 extend in parallel, at least and preferably, over the entire length of the magnets 4 and of the wall of the enclosure 1. The applicators 8 can be cooled by a flow of fluid and be coated with metallic and/or dielectric layers suitable for the application proposed for the plasma. The various applicators 8 can be separate one from the other and take a variety of forms, such as a wire element (FIGS. 1 and 2). For example, it is possible, as illustrated in FIGS. 3 to 5, to produce each applicator 8 in the form of a bar forming part of a tube 13 concentric to the wall of the enclosure 1. Said enclosure 1 is in the form of a cylinder carrying on the outside the magnets 4, angularly spaced apart from one another, in substantially regular fashion. The tube 13 is provided with longitudinal openings 14 defining the applicator bars 8 positioned so that each one extends in an inter-magnet zone 11, as specified hereinabove. The tube 13 can be supplied with microwave energy via a coaxial structure 15, as clearly shown in FIG. 5.

Figure 6:
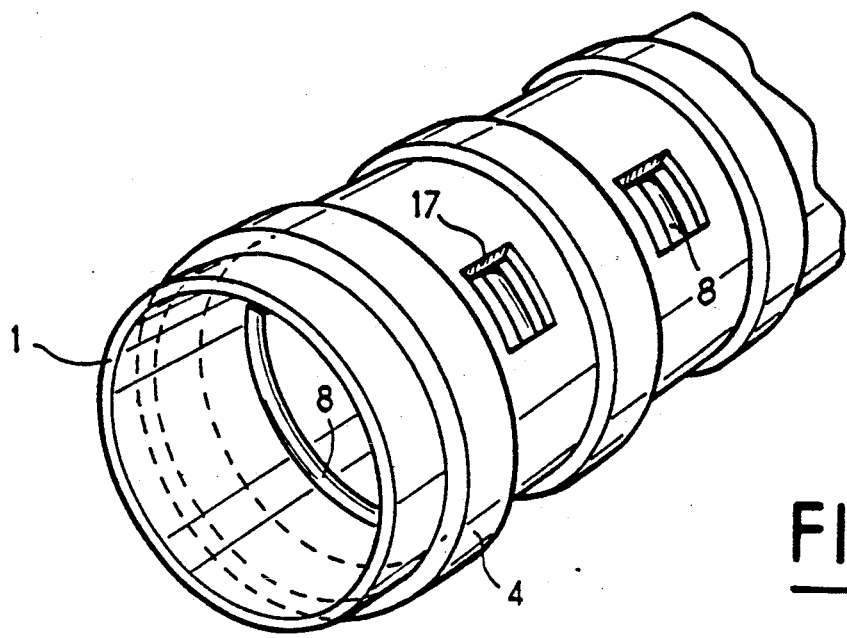
FIG. 6 illustrates another variant embodiment of a device according to the invention.

FIG. 6 illustrates another embodiment of the device according to the invention for distributing a microwave energy, comprising applicators 8 each one of which is in the form of a loop extending in parallel to the magnets 4, each one of which is in the form of a ring adapted radially on the wall of enclosure 1. As explained in details hereinabove, the magnets present, facing towards the confinement zone, a face of successively different polarity. Each loop-forming applicator 8 is positioned inside the above-defined inter-magnet zone 11. Each applicator 8 is supplied with microwave energy from any adapted means through, for example, openings 17 provided in the wall 1.

Figure 7:
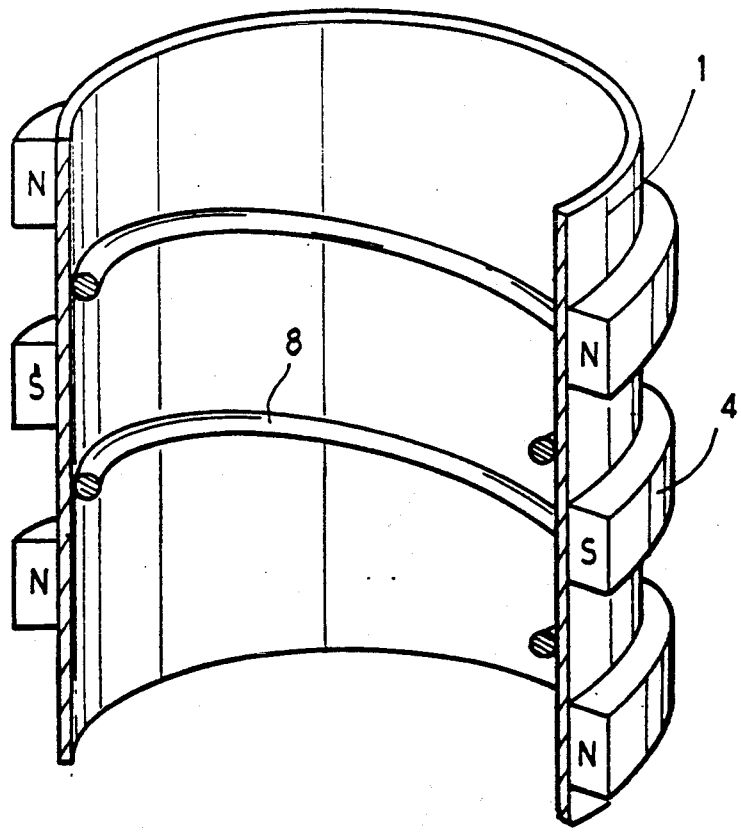
FIG. 7 is a semi-perspective of another variant embodiment of the device according to the invention.

FIG. 7 illustrates another embodiment of the distribution device according to the invention, in which the magnets 4 and applicators 8 are produced in the form of axially interposed coils, keeping to the positions defined according to the object of the invention. It is understood that the embodiments described hereinabove, concerning applicators 8 and magnets 4 are only given by way of non-restrictive examples.

The device for distributing a microwave energy according to the invention makes it possible to obtain an even excitation of the plasma over great lengths. In addition, such a device ensures an improved coupling of the microwave to the plasma and enables the microwave energy to be injected in any point of the applicator. Moreover, such a disposition authorizes the excitation of closed or open magnetic structures, for example in the form of rings, spheres or strands.

The invention is not in any way limited to the examples described and illustrated herein, and various modifications may be brought thereto without departing from its scope.

What is claimed is:

1. A device for distributing a microwave energy for exciting a plasma inside an enclosure comprising, on the one hand, at least one applicator supplying the microwave energy, and on the other hand, at least one pair of oppositely poled permanent magnets, each one of which creates a surface having a constant magnetic field and of intensity corresponding to an electron cyclotron resonance, said oppositely poled magnets being so spaced apart as to define a plasma confining surface which delimits an inter-magnet zone with part of the wall of the enclosure, wherein the applicator or applicators are placed, each one, inside the inter-magnet zone, and extended in distant relationship to the confining surface and to the enclosure wall, while being positioned outside the surface having the constant magnetic field and of intensity corresponding to the electron cyclotron resonance, in order to ensure confinement and propagation of the microwave energy between the wall and the applicator, outside of said surface.

2. Device as claimed in claim 1, wherein the applicator or applicators extend in parallel at least over part of the length of the magnets and of the enclosure wall.

3. Device as claimed in claim 1 or 2, wherein each applicator extends at a given distance from the wall so as to avoid the production of arcs of plasma between the applicator and the wall.

4. A device as claimed in claim 1, wherein each applicator is constituted by a bar forming part of a tube concentric to the enclosure, each bar extending in the inter-magnet zone, in a direction substantially parallel to the magnets which present, towards the confining surface, a face of successively different polarity.

5. A device as claimed in claim 1, wherein each applicator forms a loop extending, in the inter-magnet zone, in parallel to the magnets which constitute, each one, a ring.

6. Device as claimed in claim 1, wherein each applicator extends in coil form, in the inter-magnet zone defined by two consecutive coil-shaped magnets.

7. Device as claimed in claim 1, wherein said applicator or applicators are connected to a microwave source in any point of said applicator.

8. Device as claimed in claim 1, wherein each applicator is positioned inside the inter-magnet zone defined by two magnets situated outside the enclosure.

9. A device as claimed in claim 1, wherein said device comprises antennas which are each positioned close to the surface having the constant magnetic field and of intensity corresponding to the electron cyclotron resonance.

10. A machine for producing the plasma, comprising the device for distributing microwave energy as claimed in claim 1, a gas pumping device connected with the enclosure, and a gaseous medium supply device for keeping a predetermined pressure inside the enclosure.

* * * * *

UNITED STATES PATENT AND TRADEMARK OFFICE
CERTIFICATE OF CORRECTION

PATENT NO. :    5,216,329

DATED :         June 1, 1993

INVENTOR(S) :   Jacques Pelletier

It is certified that error appears in the above-identified patent and that said Letters Patent is hereby corrected as shown below:

On the title page, items [19] and [75] the inventors last name should read --Pelletier-- not "Pelleteir".

Signed and Sealed this

Fifth Day of April, 1994

*Attest:*

BRUCE LEHMAN

*Attesting Officer*         *Commissioner of Patents and Trademarks*